United States Patent [19]
Fukatsu et al.

[11] Patent Number: 5,830,771
[45] Date of Patent: Nov. 3, 1998

[54] MANUFACTURING METHOD FOR SEMICONDUCTOR DEVICE

[75] Inventors: Shigemitsu Fukatsu; Ryouichi Kubokoya; Akira Kuroyanagi, all of Okazaki, Japan

[73] Assignee: Nippondenso Co., Ltd., Kariya, Japan

[21] Appl. No.: 525,143

[22] Filed: Sep. 8, 1995

[30] Foreign Application Priority Data

Sep. 9, 1994 [JP] Japan ..................................... 6-215730

[51] Int. Cl.⁶ ..................... H01L 21/8247; H01L 21/265
[52] U.S. Cl. ................................. 437/43; 437/52
[58] Field of Search ................... 437/41, 43, 52

[56] References Cited

U.S. PATENT DOCUMENTS

| 4,412,310 | 10/1983 | Korsh et al. . | |
| 4,519,849 | 5/1985 | Korsih et al. . | |
| 5,571,736 | 11/1996 | Paterson et al. | 437/43 |
| 5,576,233 | 11/1996 | Hutter et al. | 437/43 |

FOREIGN PATENT DOCUMENTS

| 58-92268 | 6/1983 | Japan | 437/43 |
| 61-198682 | 9/1986 | Japan . | |
| 1152650 | 6/1989 | Japan . | |
| 6188431 | 7/1994 | Japan . | |

OTHER PUBLICATIONS

Wolf et al., "Silicon Processing for the VLSI Era Vol. 1: Process Technology", Lattice Press, pp. 532–534, 1986.

*Primary Examiner*—John Niebling
*Assistant Examiner*—Richard A. Booth
*Attorney, Agent, or Firm*—Cushman, Darby & Cushman IP Group of Pillsbury, Madison & Sutro LLP

[57] ABSTRACT

The insulating ability of a semiconductor device of two-layer gate electrode structure, such as EPROM, is improved at the upper surface of the first gate electrode as well as at the upper and lower edge parts of the first gate electrode. A LOCOS film is formed on a semiconductor substrate, and a floating gate is formed by patterning. Next, the first oxide film is formed on the floating gate, and then the first oxide film is etched out. Subsequently, the second oxide film is formed on the floating gate, and a control gate is formed on the floating gate using the second oxide film as an inter-layer insulating film. As a result of these two oxidations of the first and second oxide films and the removal of the first oxide film, the asperity of the upper surface of the floating gate is removed, and the upper and lower edge parts thereof are shaped into a round form.

23 Claims, 8 Drawing Sheets

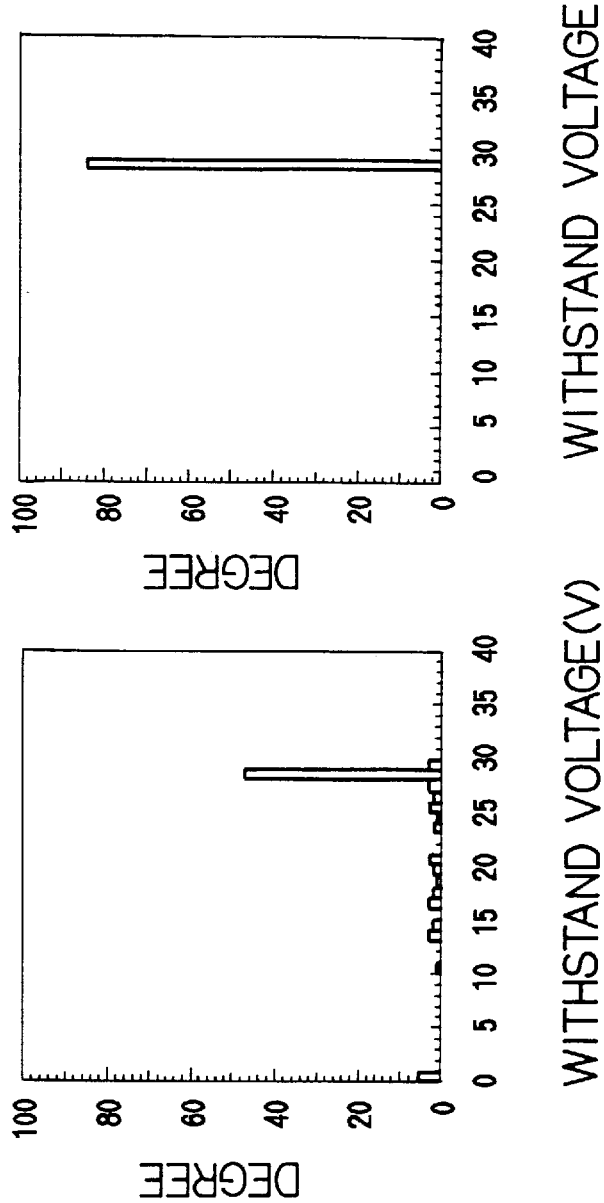

MANUFACTURING METHOD FOR SEMICONDUCTOR DEVICE

CROSS REFERENCE TO RELATED APPLICATION

This application is based upon and claims the benefit of priority of the prior Japanese Patent application No. 6-215730 filed on Sep. 9, 1994, the contents of which are incorporated herein by reference.

BACKGROUND OF THE INVENTION

1. Field of the Invention

The present invention generally relates to a manufacturing method for semiconductor devices, and more particularly to a manufacturing method for a semiconductor device of two-layer gate electrode structure, such as EPROM or EEPROM etc.

2. Related Arts

FIGS. 5A and 5B are cross-sectional views illustrating the construction of a conventional EPROM respectively, wherein FIG. 5A is the cross-sectional view taken along the length direction of a gate, and FIG. 5B is the cross-sectional view taken along the width direction of the gate.

In FIGS. 5A and 5B, on a silicon semiconductor substrate 1 is formed a field oxide film 2 by the LOCOS method (hereinafter called "LOCOS film") to define an element region. On this element region are successively formed a gate oxide film 3, a floating gate (first gate electrode) 4, an inter-layer insulating film 5 and a control gate (second gate electrode) 6 in this order. These components are covered with an insulating film 11. In the element region of the semiconductor substrate 1 are formed a source 7, a drain 8 and a channel region 9, and aluminum (Al) electrode wirings 10 for the source 7 and drain 8. In these figures, an Al wiring for the control gate 6 is not illustrated. On the surfaces of the whole elements are formed a protective film 12.

A manufacturing method for this EPROM will be described by using FIGS. 6A through 6H.

After forming a pad oxide film 3a on the semiconductor substrate 1, the LOCOS film 2 is formed by the LOCOS method using a nitride film (Si$_3$N$_4$) 13, and element separation is applied to the other element regions (FIG. 6A). After removing the nitride film 13 and the pad oxide film 3a, the gate oxide film 3 is formed and ion implantation is made to form the channel region 9 (FIG. 6B).

Subsequently, a polysilicon (Poly-Si) is formed by the CVD method, and N-type dopant is doped by means of ion implantation or thermal diffusion in or after the formation of the polysilicon (FIG. 6C). Then, the floating gate 4 is formed by selectively etching the polysilicon with a resist mask 14 by applying the photolithographic technique for patterning (FIG. 6D). Following this process, the inter-layer insulating film 5 is formed by the thermal oxidation method. For example, oxidation is made at 1,050° C. in dry oxygen for 7 minutes to form the inter-layer insulating film of 350 Å thick (FIG. 6E). Furthermore, the threshold values of peripheral transistors, such as n-channel transistor and p-channel transistor, are adjusted by ion implantation.

Next, a polysilicon is formed on the element surface by the CVD method, and in the same way as the formation of the floating gate 4, the control gate 6 is formed by doping an n-type dopant and patterning is made with a resist mask (FIG. 6F).

Then, an oxide film is formed around the control gate 6 by applying the thermal oxidation again. After forming a source and a drain by ion implantation, an insulating film 11 is formed (FIG. 6G). After making a contact hole for Al electrode wiring formation in the insulating film 11, Al electrode wirings are formed for the source, drain and control gate 6. Lastly, a protective film 12 is formed (FIG. 6H).

Recently, the micronization of elements for the EPROM constructed as described above has progressed, and so much so that the inter-layer insulating film 5 between the floating gate 4 and the control gate 6 has been made thinner.

When the inter-layer insulating film 5 becomes so thinner, the charge charged into the floating gate 4 is removed and a problem generally called "gate stress" occurs.

As illustrated in FIG. 7, a memory array is composed of a plurality of EPROM cells. When data is written into any one of these cells or the written data is read from any one of these cells, the word line and bit line connected to the intended cell are selected to select that intended cell. However, as a word line is commonly connected to control gates of a plurality of cells in the same column of the memory array as illustrated in FIG. 7, in order to operate a specific cell, voltage is concurrently applied to the other cells arranged in the same column as the specific cell, and due to this voltage application, the charge is removed from the floating gate 4. This phenomenon is the "gate stress."

As illustrated in FIG. 8, this gate stress occurs at the asperity of the upper surface, the upper edge part and lower the edge part (A through C respectively) of the floating gate 4.

A method for preventing such gate stress is proposed in the U.S. Pat. No. 4,412,310. According to this method, the inter-layer insulating film is thickened at the floating gate end parts to prevent gate stress. In order to thicken the film at the floating gate end parts, after the floating gate is formed, the inter-layer insulating film and the nitride film are formed, patterned and thermally oxidized to thicken the inter-layer insulating film at the edge parts.

However, according to this method, as the inter-layer insulting film is thickened at the floating gate edge parts, a patterning process is additionally required, and for this reason a photolithographic process has to be added.

SUMMARY OF THE INVENTION

In view of the above problem, the present invention has an object to provide a manufacturing method for semiconductor devices which can improve the insulating ability of the first gate electrode without adding a photolithographic process.

A manufacturing method for semiconductor device according to the present invention is characterized by comprising steps of: forming on a semiconductor substrate a gate insulating film and a thick oxide film thicker than the gate insulating film and forming an element region; forming on the element region a first gate electrode extending to the thick oxide film with the gate insulating film interposed therebetween; partially etching the thick oxide film located under a lower edge part of the first gate electrode using the first gate electrode as an etching mask; forming an oxide film on the exposed surface of the first gate electrode, whereby at least the lower edge part of the first gate electrode is rounded; forming a second gate electrode on the first gate electrode with the oxide film interposed therebetween; and forming an element component in the element region.

Here, the partial etching of the thick oxide film can be realized by thermally oxidizing the exposed surface part of the first gate electrode, then removing the thermal oxide film and overetching the surface of the thick oxide film.

In this way, according to the present invention, the inter-layer insulating film is formed by oxidizing the first gate electrode after etching the thick oxide film under the lower edge part of the first gate electrode. Accordingly, as the lower edge part of the first gate electrode is formed as if the thick oxide film was scooped out, oxygen can easily flow into the scooped part in the subsequent oxidization and the edge can be rounded. As a result, the electric field concentration at the edge part of the first gate electrode can be restrained, and therefore the insulation ability at the gate edge can be improved. Furthermore, there is no need to add a mask process, i.e., a photolithographic process.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIGS. 1A and 1B are cross-sectional views illustrating the structure of an EPROM obtained by a manufacturing method according to an embodiment of the present invention, wherein FIG. 1A is a cross-sectional view taken along the length direction of a gate, and FIG. 1B is a cross-sectional view taken along the width direction of the gate;

FIGS. 4A and 4B are histograms illustrating the results of comparative study in the withstand voltage of the inter-layer insulating film between the conventional manufacturing method and the manufacturing method according to the present invention, respectively;

FIGS. 5A and 5B are cross-sectional views illustrating the structure of the conventional EPROM, wherein FIG. 5A is a cross-sectional view taken along the length direction of a gate, and FIG. 5B is a cross-sectional view taken along the width direction of the gate;

DETAILED DESCRIPTION OF THE PRESENTLY PREFERRED EXEMPLARY EMBODIMENTS

The present invention will now be described with reference to preferred embodiments illustrated in the accompanying drawings.

Figure 1A:
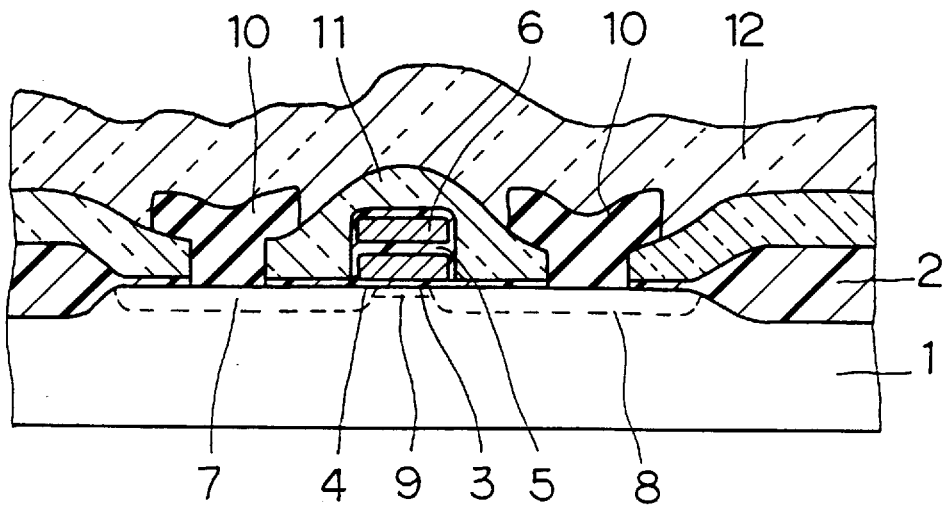
Figure 1B:
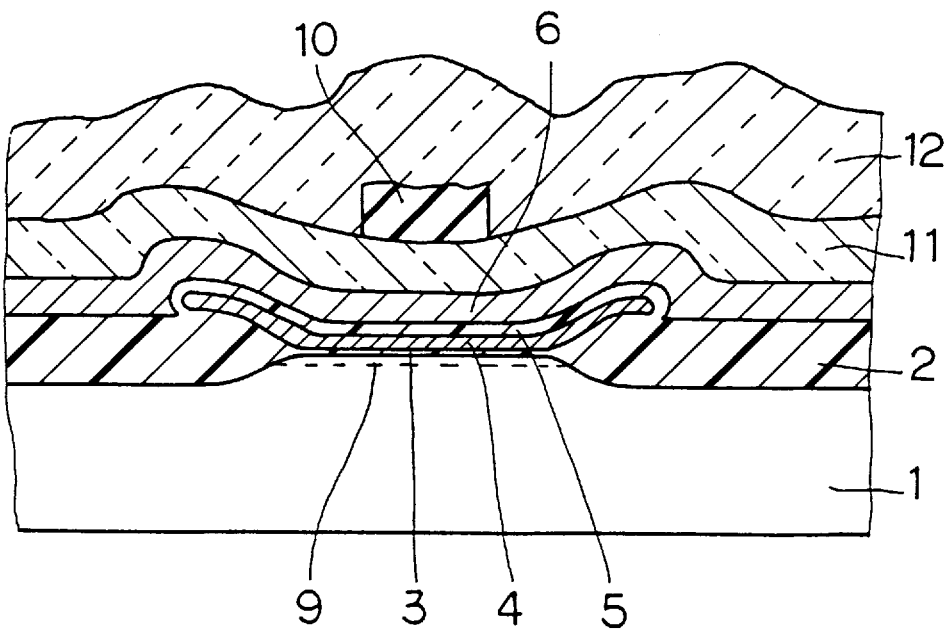
Figure 5A:
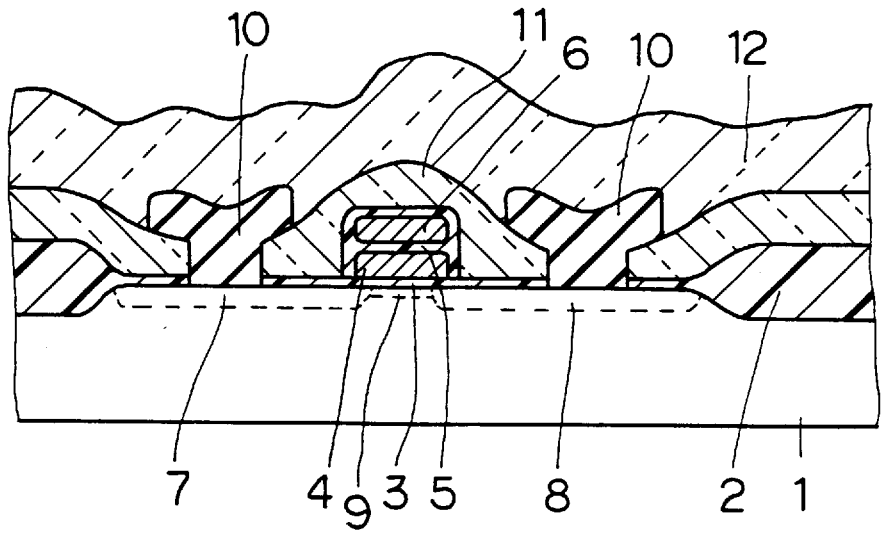
Figure 5B:
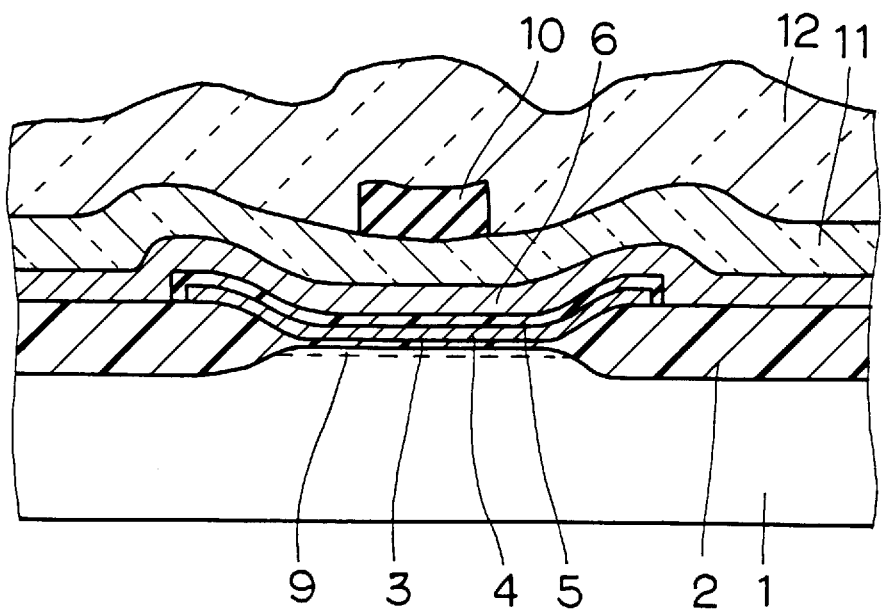

FIGS. 1A and 1B illustrate cross-sectional views of an EPROM manufactured by a method according to an embodiment of the present invention. FIG. 1A illustrates a cross-sectional view taken along a direction of a gate length, and FIG. 1B illustrates a cross-sectional view taken along a direction of a gate width. The structure illustrated in these figures is different from the structure illustrated in FIGS. 5A and 5B in that the surface asperity of a floating gate 4 is removed and the upper and lower edge parts thereof are rounded to prevent electric field concentration and the removal of charge (gate stress) from the floating gate 4.

The manufacturing method of such EPROM will be described by using FIGS. 2A through 2F.

FIGS. 2A through 2F illustrate the processes from the formation of the floating gate 4 to the formation of a control gate 6 in correspondence to the processes illustrated FIGS. 6C to 6F respectively, the other processes being the same as those illustrated in FIGS. 6A, 6B, 6G and 6H.

Figure 2A:
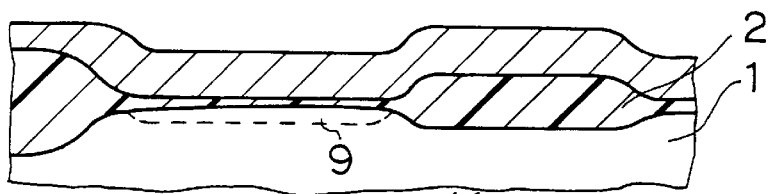
FIGS. 2A through 2F are views illustrating the manufacturing processes of the EPROM according to the embodiment of the present invention covering from the formation of a floating gate 4 to the formation of a control gate 6.
Figure 2B:
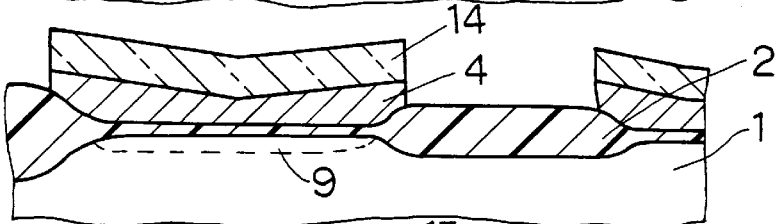
Figure 6A:
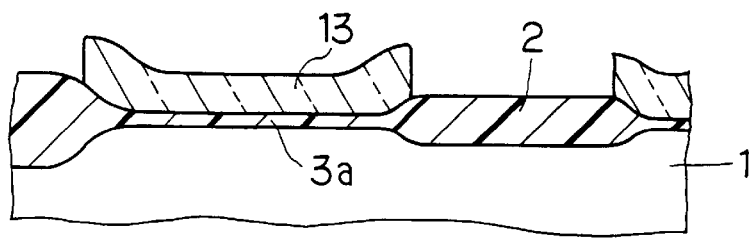
FIGS. 6A through 6H are views illustrating the conventional manufacturing method for EPROM.
Figure 6B:
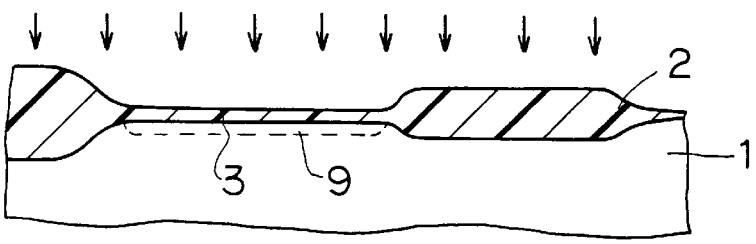
Figure 6C:
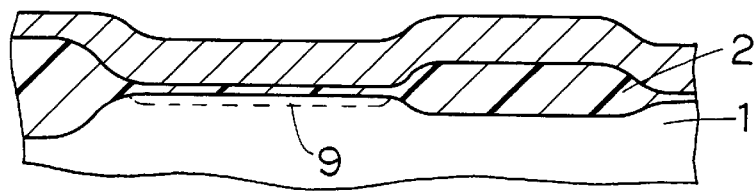
Figure 6D:
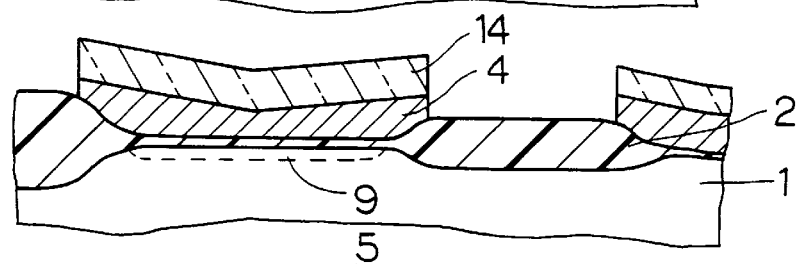

First, as illustrated in FIGS. 6A and 6B, a LOCOS film 2 is formed to define the element region, and ion implantation is made to form a channel region. Subsequently, in the same ways as those illustrated in FIGS. 6C and 6D, a floating gate 4 is formed by depositing a polysilicon (as shown in FIG. 2) and patterning the deposited polysilicon using a silicon nitride film 14 (as shown in FIG. 2B). Incidentally, the floating gate 4 of polysilicon is doped with N-type dopant and is patterned into a shape such that the edge parts thereof extend to a region over the LOCOS film 2.

Figure 2C:
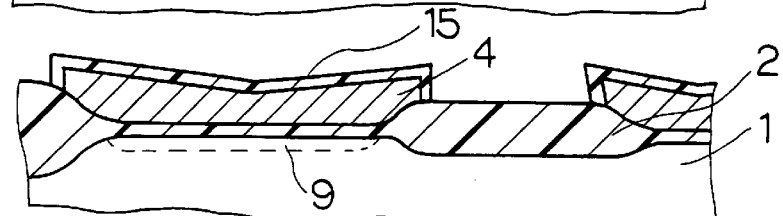

After forming the floating gate 4, a thermal oxide film 15 is formed by a thermal oxidation method. For example, oxidation is performed for 5 minutes at 1,050° C. in dry oxygen atmosphere to form a thermal oxide film 15 of 350 Å thick (FIG. 2C). As a result of this oxidation, the upper surface and side walls of the floating gate 4 are oxidized.

Figure 2D:
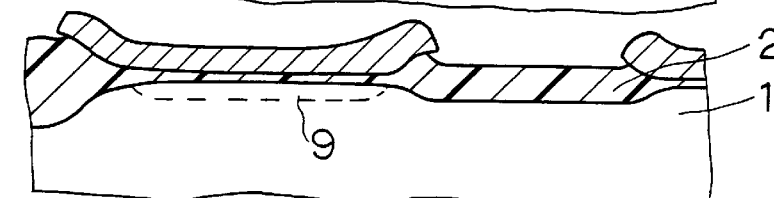

Next, the thermal oxide film 15 is etched out with wet etching using hydrofluoric acid, for example (FIG. 2D).

Figure 2E:
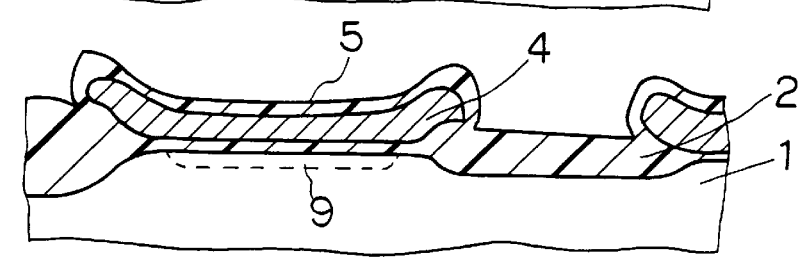
Figure 2F:
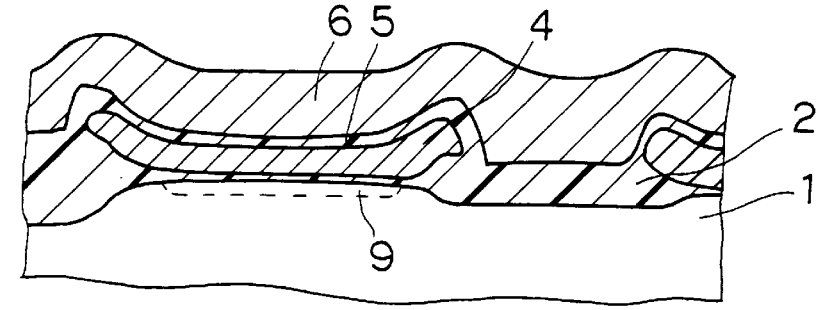
Figure 6E:
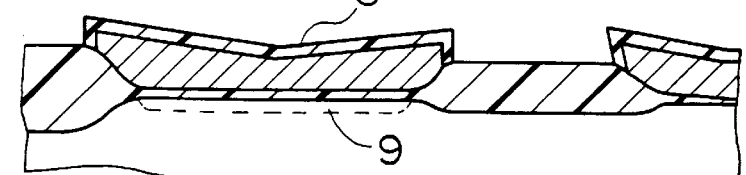
Figure 6F:
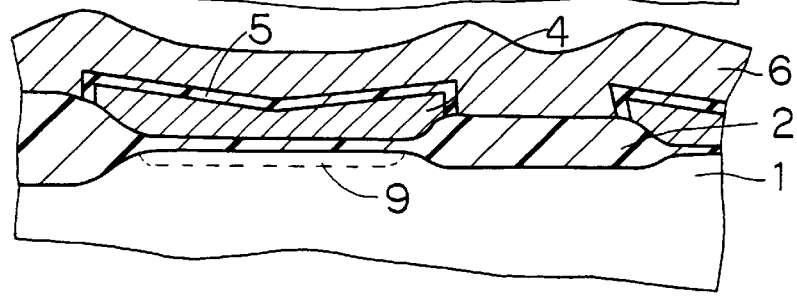

Then, in the same ways as ones illustrated in FIGS. 6E and 6F, an inter-layer insulating film 5 is formed by the thermal oxidation method (FIG. 2E). After the necessary adjustment to the threshold value, a control gate 6 is formed (FIG. 2F).

Figure 6G:
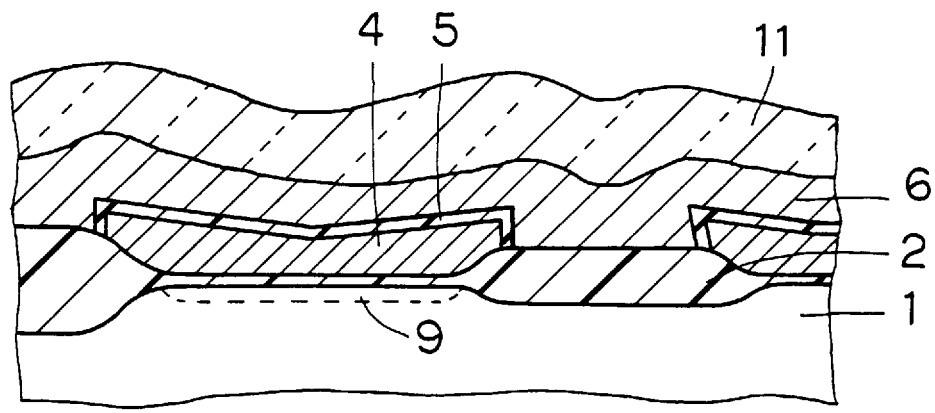
Figure 6H:
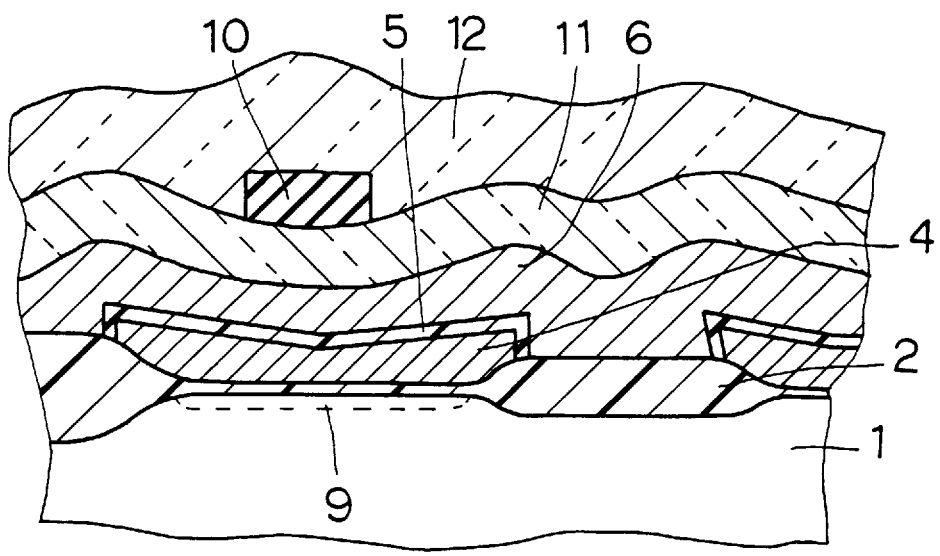
Figure 7:
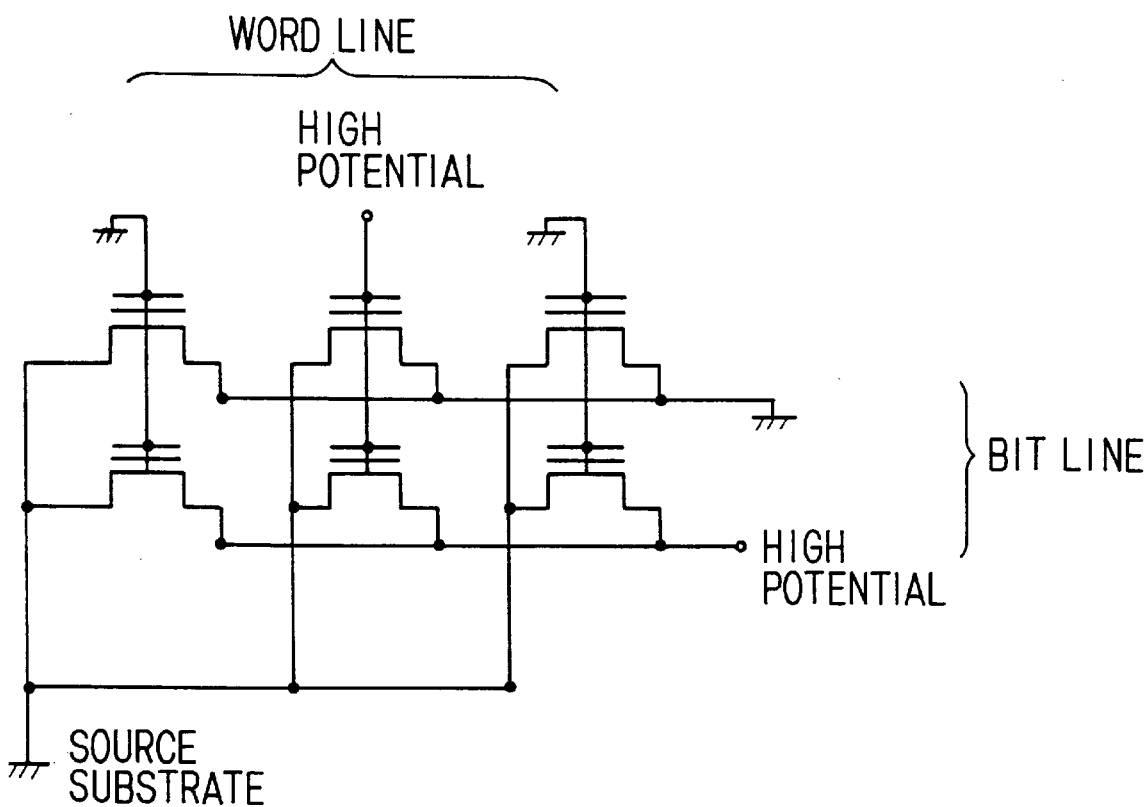
FIG. 7 is an electric wiring diagram for describing the operation of a plurality of cells in an EPROM.
Figure 8:
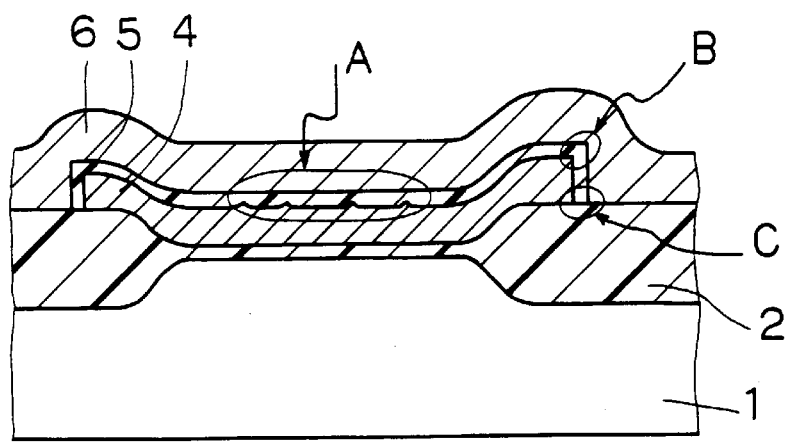
FIG. 8 is a view illustrating a portion of the floating gate 4 of an EPROM where gate stress occurs.

Next, as illustrated in FIGS. 6G and 6H, a source region 7 and a drain region 8, an insulating film 11, contact holes, Al electrodes 10 and a protective film 12 are successively formed to thereby complete the EPROM shown in FIGS. 1A and 1B.

According to the above manufacturing method, the upper surface and side walls of the floating gate 4 composed of polysilicon are oxidized twice during the formation of the inter-layer insulating film 5. Therefore, compared with the conventional manufacturing method with one oxidation, asperity on the upper surface is removed and smoothed, and the upper end parts of the floating gate 4 forming corner parts are rounded.

The lower end parts of the floating gate 4 are little oxidized according to the conventional manufacturing method. In the above embodiment, however, the thermal oxide films 15 on the side walls of the floating gate 4 are etched in the etching process illustrated in FIG. 2D. By this etching, the LOCOS film 2 under the edge of the floating gate 4 is overetched as if the end parts of the floating gate 4 were overhung. Accordingly, oxygen can easily flow into these parts during the oxidation for the formation of the inter-layer insulating film 5, and the lower edge parts of the floating gate 4 can be transformed into a round shape. This point will now be elaborated referring to FIGS. 3A through 3C.

Figure 3A:
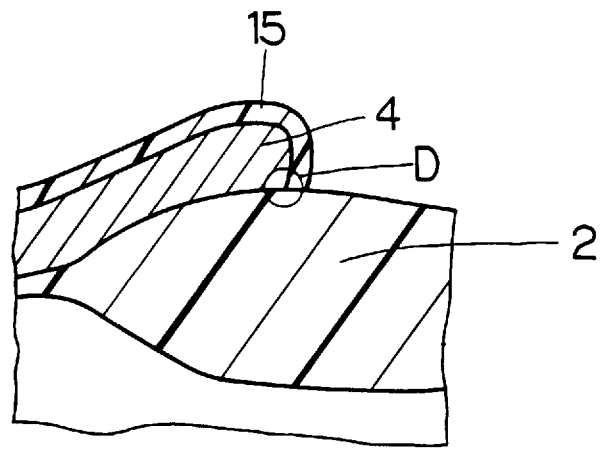
FIGS. 3A through 3C are views for describing the states that the upper and lower edge parts of the floating gate 4 are shaped into round forms.
Figure 3B:
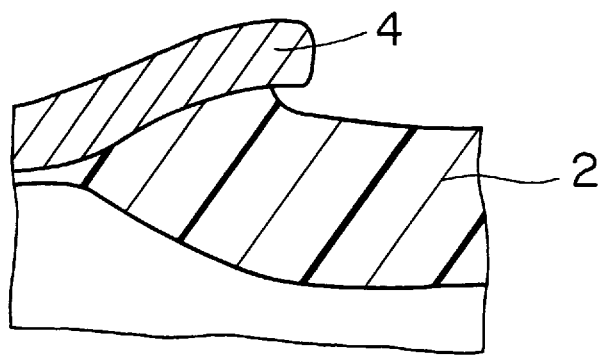
Figure 3C:
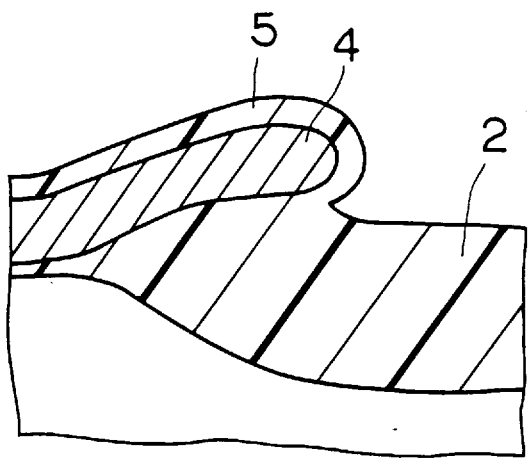

When the oxide film 15 is formed in the process illustrated in FIG. 2C, an edge part indicated by D is slightly rounded as illustrated in FIG. 3A. Due to etching in the process illustrated in FIG. 2D, the isotropic etching is progressing making the floating gate 4 an etching mask, and therefore the underlying LOCOS film 2 is also etched concurrently with the etching of the oxide film 15 into a shape illustrated in FIG. 3B as if the part under the lower edge part of the floating gate 4 is scooped out. When the second oxidation is performed in the process illustrated in FIG. 2E, since oxygen can easily flow into the scooped part under the lower edge part of the floating gate 4, the lower edge part of the floating gate 4 is rounded as illustrated in FIG. 3C.

Therefore, according to the manufacturing method described above, the asperity of the floating gate 4 is removed and smoothed, and the upper and lower edge parts are rounded. As a result, electric field concentration can be mitigated there, and the gate stress can be prevented.

Furthermore, according to the conventional manufacturing method, since the inter-layer insulating film 5 is formed immediately after the removal of a resist mask 14, residual resist mask may mix into the inter-layer insulating film 5. However, according to the manufacturing method of the present embodiment, since the oxide film 15 is formed after the removal of the resist mask 14 and then removed, the inter-layer insulating film 5, which is formed after the removal of the oxide film 15, becomes a high quality film. That is to say, according to the embodiment, the mixing of the residual resist mask into the inter-layer insulating film 5 can be prevented, and as a result, the inter-layer insulating film 5 can be formed to a high quality.

FIGS. 4A and 4B are histograms illustrating the results of the study in the withstand voltage of the inter-layer insulating film according to the conventional manufacturing method and the manufacturing method of this embodiment respectively. As evident from FIGS. 4A and 4B, the manufacturing method according to this embodiment can substantially improve the withstand voltage in the initial and intermediate ranges.

In the above embodiment, the application of the present invention to EPROM is described. However, the present invention may also be applied to other semiconductor devices of two-layer gate electrode structure, such as EEPROM, flash memory, DRAM and two-layer polysilicon capacitor. In this case, by the above improvement in the withstand voltage of the inter-layer insulating film, effects, such as the reduction in the gate stress of the non-volatile memory, the reduction in the charge leakage from the polysilicon capacitor and improvement in capacity precision, can be obtained.

In addition, although the gate electrode is formed with polysilicon in the above embodiment, the gate electrode of two-layer structure with a polycide formed on the polysilicon may be used.

Furthermore, in the above embodiment, in order to etch the thermal oxide film 15 and the underlying LOCOS film 2, wet etching using hydrofluoric acid is performed. However, the etchant used is not limited to the above hydrofluoric acid, any hydrofluoric-based etchant, which can isotropically etch an oxide film, such as bufferred hydrofluoric acid (BHF: HF+NH$_4$F) may be applicable.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A manufacturing method for a semiconductor device, comprising the steps of:

forming on a semiconductor substrate a gate insulating film and a thick oxide film thicker than said gate insulating film, whereby an element region is defined by said thick oxide film;

forming on said semiconductor substrate a first gate electrode with said gate insulating film interposed therebetween such that said first gate electrode has a shape extending to a region on said thick oxide film;

etching at least a portion of said thick oxide film located under a lower edge part of a side surface of said first gate electrode using said first gate electrode as an etching mask;

forming an insulating film comprising an oxide film on an upper surface and said side surface of said first gate electrode, said oxide film being formed by oxidizing an entire exposed surface part of said first gate electrode, whereby at least said lower edge part of said side surface of said first gate electrode is rounded;

forming a second gate electrode surrounding said upper and side surfaces of said first gate electrode with said oxide film interposed therebetween, whereby a part of the second gate electrode faces said lower edge part of said side surface of said first gate electrode rounded by said step of forming said insulating film; and forming an element component in said element region.

2. A manufacturing method for a semiconductor device according to claim 1, wherein said step of etching said thick oxide film includes steps of:

forming a temporary oxide film at least on a side surface of said first gate electrode; and removing said temporary oxide film while said thick oxide film located under said lower edge part of said first electrode is overetched.

3. A manufacturing method for a semiconductor device according to claim 2, wherein said step of removing said temporary oxide film includes an isotropic etching of thick oxide film.

4. A manufacturing method for a semiconductor device according to claim 3, wherein said isotropic etching uses hydrofluoric-based etchant.

5. A manufacturing method for a semiconductor device according to claim 4, wherein said hydrofluoric-based etchant comprises hydrofluoric acid.

6. A manufacturing method for a semiconductor device according to claim 3, wherein said step of forming a temporary oxide film includes forming said temporary oxide film by oxidizing an upper surface and said side surface of said first gate electrode.

7. A manufacturing method for a semiconductor device according to claim 1, wherein said step of etching said thick oxide film includes isotropically etching said thick oxide film using hydrofluoric acid.

8. A manufacturing method for a semiconductor device according to claim 1, wherein said step of forming said thick oxide film includes oxidizing said semiconductor substrate by means of a LOCOS method.

9. A manufacturing method for a semiconductor device, comprising the steps of:

forming on a semiconductor substrate a gate insulating film and a thick oxide film thicker than said gate insulating film, wherein said thick oxide film defines an element region;

forming a first gate electrode, which extends to a region on said thick oxide film, on said semiconductor substrate so that said gate insulating film interposes said first gate electrode and said semiconductor substrate;

forming a first oxide film on an entire exposed surface of said first gate electrode;

etching said first oxide film, whereby said thick oxide film located under a lower edge part of a side surface of said first gate electrode is partially overetched;

forming a second oxide film on an exposed surface part of said first gate electrode by oxidizing said exposed surface part of said first gate electrode, whereby an asperity of an upper surface of said first gate electrode is removed and an upper edge part and said lower edge part of said first gate electrode are rounded;

forming a second gate electrode on said first gate electrode, said second gate electrode surrounding said upper and side surfaces of said first gate electrode, said second oxide film being interposed therebetween; and forming an element component in said element region.

10. A manufacturing method for a semiconductor device according to claim 9, wherein said step of forming a first oxide film includes oxidizing said entire exposed surface of said first gate electrode.

11. A manufacturing method for a semiconductor device according to claim 9, wherein said step of etching said first oxide film includes isotropically etching said first oxide film using hydrofluoric-based etchant.

12. A manufacturing method for a semiconductor device according to claim 11, wherein said hydrofluoric-based etchant comprises hydrofluoric acid.

13. A manufacturing method for a semiconductor device, comprising the steps of:

forming on a semiconductor substrate a gate insulating film and a LOCOS film thicker than said gate insulating film, whereby a memory cell region is defined by said LOCOS film;

forming a floating gate on said semiconductor substrate with said gate insulating film interposed therebetween, wherein said floating gate has a pattern extending to a region on said LOCOS film;

forming a first oxide film on an upper and side surfaces of said floating gate by oxidizing said upper and side surfaces of said floating gate;

removing said first oxide film by an isotropic etching, whereby said LOCOS film located under a lower edge part of said floating gate is partially etched;

forming a second oxide film on an exposed surface of said floating gate by oxidizing said exposed surface of said floating gate, whereby an asperity of said upper surface of said floating gate is removed, and an upper edge part and said lower edge part of said floating gate are rounded;

forming a control gate on said floating gate, said second oxide film being interposed therebetween; and forming a source and a drain in said memory cell region.

14. A manufacturing method for a semiconductor device, comprising the steps of:

forming on a semiconductor substrate a gate insulating film and a thick oxide film thicker than said gate insulating film, whereby an element region is defined by said thick oxide film;

forming on said semiconductor substrate a first gate electrode with said gate insulating film interposed therebetween such that said first gate electrode has a shape extending to a region on said thick oxide film;

partially etching said thick oxide film located under a lower edge part of said first gate electrode using said first gate electrode as an etching mask;

forming an oxide film on an upper and side surfaces of said first gate electrode by oxidizing an entire exposed surface part of said first gate electrode, whereby at least said lower edge part of said first gate electrode is rounded;

forming a second gate electrode on said first gate electrode, said oxide film being interposed therebetween; and forming an element component in said element region, wherein said step of partially etching said thick oxide film includes steps of:
  forming a temporary oxide film at least on a side surface of said first gate electrode; and
  removing said temporary oxide film while said thick oxide film located under said lower edge part of said first electrode is overetched.

15. A manufacturing method for a semiconductor device according to claim 14, wherein said step of removing said temporary oxide film includes an isotropic etching of oxide film.

16. A manufacturing method for a semiconductor device according to claim 15, wherein said isotropic etching uses hydrofluoric-based etchant.

17. A manufacturing method for a semiconductor device according to claim 16, wherein said hydrofluoric-based etchant comprises hydrofluoric acid.

18. A manufacturing method for a semiconductor device according to claim 15, wherein said step of forming a temporary oxide film includes forming said temporary oxide film by oxidizing an upper surface of said side surface of said first gate electrode.

19. A manufacturing method for a semiconductor device according to claim 14, wherein said step of partially etching said thick oxide film includes isotropically etching said thick oxide film using hydrofluoric acid.

20. A manufacturing method for a semiconductor device according to claim 14, wherein said step of forming said thick oxide film includes oxidizing said semiconductor substrate by means of a LOCOS method.

21. A manufacturing method for a semiconductor device, comprising the steps of:

forming on a semiconductor substrate a gate insulating film and a thick oxide film thicker than said gate insulating film, wherein said thick oxide film defines an element region;

forming a first gate electrode, which extends to a region on said thick oxide film, on said semiconductor substrate so that said gate insulating film interposes said first gate electrode and said semiconductor substrate;

forming a first oxide film on an entire exposed surface of said first gate electrode;

etching said first oxide film, whereby said thick oxide film located under a lower edge part of said first oxide film is partially etched;

forming a second oxide film on an exposed surface part of said first gate electrode by oxidizing said exposed surface part of said first gate electrode, whereby an asperity of an upper surface of said first gate electrode is removed and an upper edge part and said lower edge part of said first gate electrode are rounded;

forming a second gate electrode on said first gate electrode interposing said second oxide film; and forming an element component in said element region, wherein said step of etching said first oxide film includes isotropically etching said first oxide film using hydrofluoric-based etchant.

22. A manufacturing method for a semiconductor device according to claim 21, wherein said hydrofluoric-based etchant comprises hydrofluoric acid.

23. A manufacturing method for a semiconductor device according to claim 21, wherein said step of forming a first oxide film includes oxidizing said entire exposed surface of said first gate electrode.

* * * * *